United States Patent
Dinh et al.

(10) Patent No.: US 8,945,281 B1
(45) Date of Patent: Feb. 3, 2015

(54) METHOD AND APPARATUS FOR VAPOR GENERATION AND WAFER CLEANING

(71) Applicant: MSP Corporation, Shakopee, MN (US)

(72) Inventors: Thuc M. Dinh, Shakopee, MN (US); Yamin Ma, Roseville, MN (US); Benjamin Y. H. Liu, North Oaks, MN (US)

(73) Assignee: MSP Corporation, Shoreview, MN (US)

( * ) Notice: Subject to any disclaimer, the term of this patent is extended or adjusted under 35 U.S.C. 154(b) by 0 days.

(21) Appl. No.: 14/168,692

(22) Filed: Jan. 30, 2014

(51) Int. Cl.
*B01D 19/00* (2006.01)
*H01L 21/02* (2006.01)

(52) U.S. Cl.
CPC ................................ *H01L 21/02* (2013.01)
USPC .................................. 95/251; 95/252; 96/155

(58) Field of Classification Search
USPC ................................ 95/241, 251, 252; 96/155
See application file for complete search history.

(56) References Cited

U.S. PATENT DOCUMENTS

| | | | |
|---|---|---|---|
| 3,069,863 A * | 12/1962 | van der Ster et al. | 62/617 |
| 5,315,766 A | 5/1994 | Roberson, Jr. et al. | |
| 5,356,451 A * | 10/1994 | Cain et al. | 65/414 |
| 5,369,891 A | 12/1994 | Kamikawa | |
| 5,571,337 A | 11/1996 | Mohindra et al. | |
| 5,671,554 A | 9/1997 | Geelhoed | |
| 5,855,077 A | 1/1999 | Nam et al. | |
| 6,029,371 A | 2/2000 | Kamikawa et al. | |

* cited by examiner

*Primary Examiner* — Robert A Hopkins
(74) *Attorney, Agent, or Firm* — Westman, Champlin & Koehler, P.A.; Z. Peter Sawicki

(57) ABSTRACT

The present disclosure describes an apparatus and a method for generating IPA vapor for condensation on a substrate in order to provide a vapor that is substantially free of particulate and molecular contaminants. The apparatus includes an inlet for liquid to enter, and a plurality of heated sloped surfaces to create thin sheets of flowing liquid on the surfaces from which the liquid can vaporize to form vapor. The liquid flows from one surface to another, vaporizing the liquid.

22 Claims, 4 Drawing Sheets

METHOD AND APPARATUS FOR VAPOR GENERATION AND WAFER CLEANING

BACKGROUND OF THE DISCLOSURE

The process of creating a vapor from a liquid usually involves heating the liquid to a sufficiently high temperature to form vapor. In semiconductor device fabrication, the drying of wafer using isopropyl alcohol (IPA) vapor is an important and well-known wafer processing step (see U.S. Pat. Nos. 5,315,766, 5,369,891, 5,571,337, 5,671,554, 5,855,077 and 6,029,371). In this process, the vaporized IPA is allowed to condense on the wafer surface to wash away molecular and particulate contaminant on the surface. The result is a clean wafer surface suitable for the subsequent wafer processing steps in semiconductor integrated-circuit device manufacturing.

FIG. 1 shows a traditional approach to vapor generation by means of a boiler. The boiler, shown generally located at 100, includes a vessel filled with liquid IPA to level 120, an immersion heater 110 to supply the needed heating energy to vaporize the liquid, and an outlet 130 for the vapor to flow out and exit the boiler. During the vaporization process, a great deal of heat is transferred from the heater to the liquid to cause bubbles 115 to form in the liquid as depicted. When a bubble 125 rises to the liquid surface 120 the bubble would burst to form a cloud of small droplets. The droplets then evaporate leaving behind small non-volatile residue particles 130 suspended in the vapor. These residue contaminant particles would then be carried by the vapor flowing out of the boiler through outlet 135 to contaminate wafers located downstream, leading to the loss of product yield in the subsequent wafer processing steps.

SUMMARY OF THE DISCLOSURE

An apparatus and a method are described herein to generate vapor of isopropyl alcohol liquid. The apparatus comprises an inlet for liquid to enter and a plurality of heated sloped surfaces to create thin layers of liquid on the surfaces from which the liquid can vaporize to form vapor. In one embodiment, the plurality of heated sloped surfaces are arranged in a vertical array such that liquid from an upper sloped surface will flow onto a lower sloped surface. In another embodiment, the plurality of sloped surfaces are arranged in a vertical zigzag configuration such that liquid will flow from an upper sloped surface to a lower sloped surface.

The method comprises heating an apparatus to a selected set-point temperature wherein the apparatus comprises a plurality of heated sloped surfaces to create thin sheets of liquid that would slide down off the surfaces by gravity to form vapor. Introducing said liquid through an inlet of the apparatus such that thin sheets of the liquid are formed on the sloped surfaces, and controlling the rate of liquid flow to a selected set-point value.

In one embodiment, the method further comprises wherein the plurality of heated sloped surfaces are arranged in a vertical array such that liquid from an upper sloped surface flows onto a lower sloped surface. In another embodiment, the plurality of sloped surfaces are arranged in a vertical zigzag configuration such that liquid flows from an upper sloped surface to a lower sloped surface.

A method generates isopropyl alcohol (IPA) vapor for condensation on a substrate to produce a surface on the substrate substantially free of particulate contaminants. The method comprises providing liquid IPA in the form of a sheet of liquid sliding down on an inclined heated surface, to produce IPA vapor, the vapor being formed by surface evaporation with very few, if any, bubbles being formed. The vapor then flows through vapor channels that form naturally in the flowing liquid sheets to permit the IPA vapor be collected for condensation on the substrate.

DESCRIPTION OF THE EXEMPLARY EMBODIMENTS

The present disclosure describes an apparatus and a method for generating IPA vapor for application in semiconductor device fabrication. The liquid IPA is heated in a boiler to a sufficiently high temperature to form vapor. Vaporization is accomplished by flowing the liquid IPA onto a heated metal surface of the boiler to form a sheet of liquid on the surface. Vaporization then takes place from this heated surface liquid sheet without much, if any bubbling, thereby greatly reducing or eliminating the generation of the undesirable residue particles in the output vapor stream.

Figure 1:
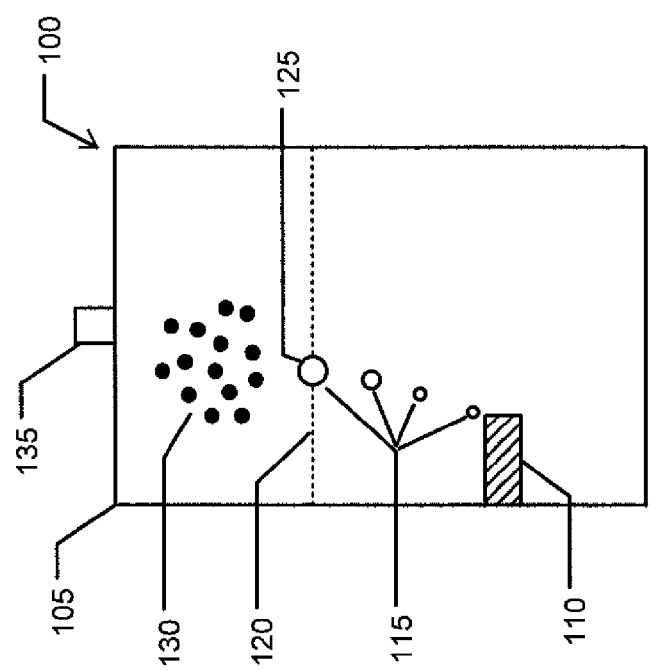
FIG. 1 is a schematic diagram of a prior art boiler for generating IPA vapor using a traditional immersion heater
Figure 2:
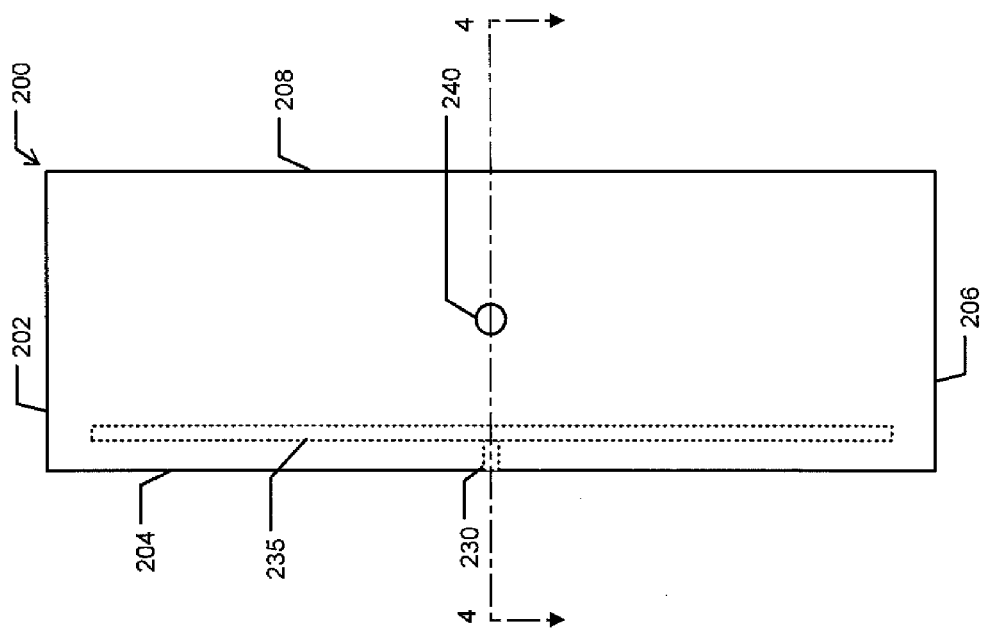
FIG. 2 is a top view of the vapor generating apparatus of this disclosure in its preferred embodiment.

The present disclosure describes an embodiment of an apparatus for generating vapor of isopropyl alcohol (IPA). The apparatus is generally constructed of metal, typically, aluminum. The apparatus is shown generally at 200 as illustrated in FIG. 2. The apparatus is provided with solid metal panels 202, 204, 206 and 208 forming the outer vertical walls, and horizontal metal panels, 210 and 212 forming the top and bottom panels for the outer enclosure. The apparatus is heated by a suitable heater and kept at a suitably high temperature in order to vaporize liquid IPA introduced into the apparatus to generate vapor.

Figure 3:
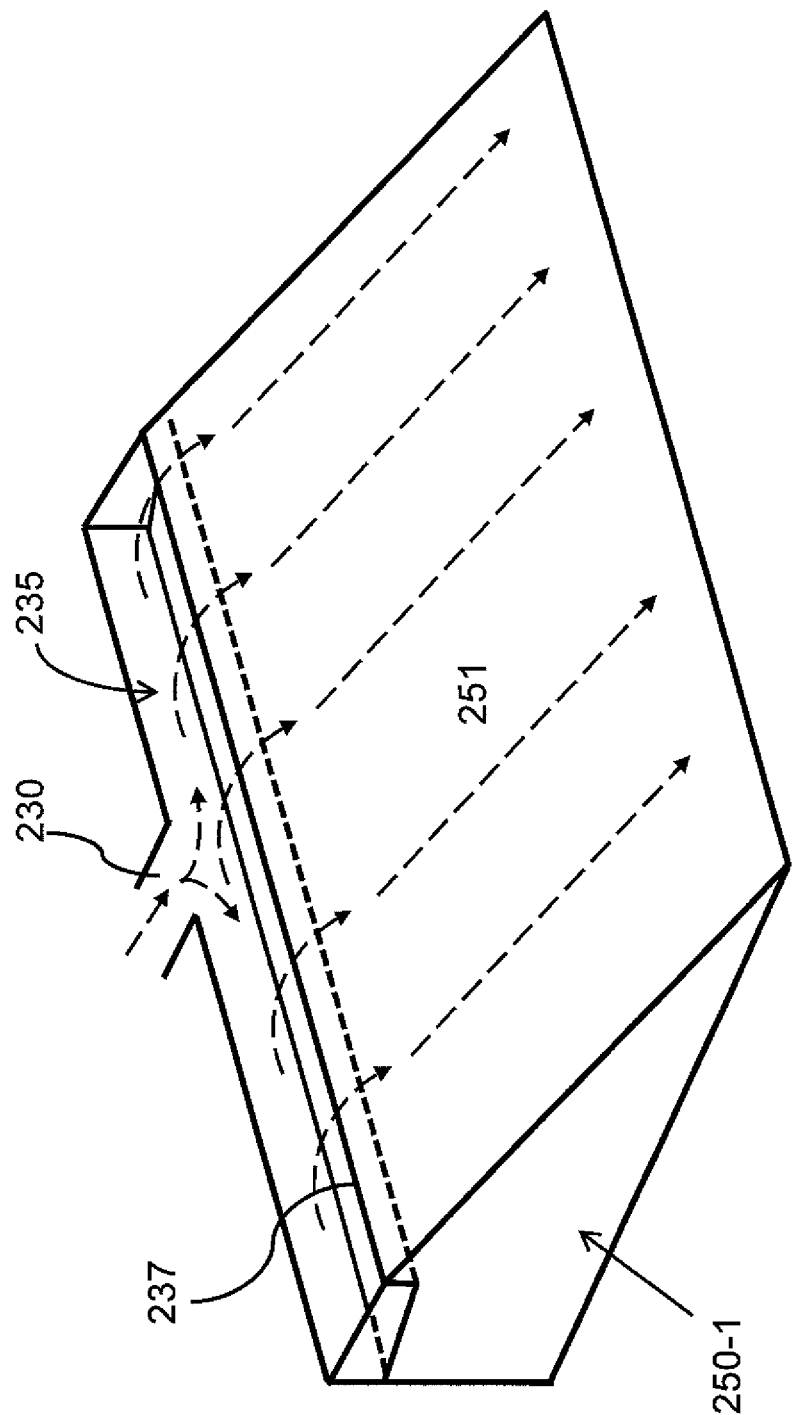
FIG. 3 is a perspective view of an uppermost sloped surface and a trough in which liquid entering the apparatus is received for distribution as a sheet.
Figure 4:
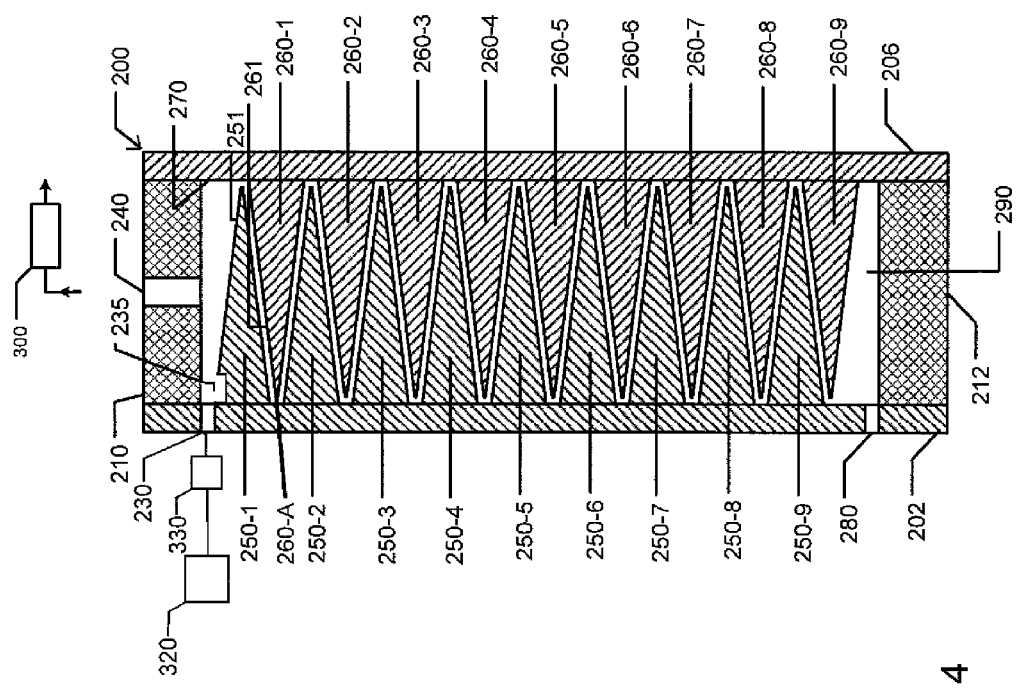
FIG. 4 is a vertical sectional view along line 4-4 of the vapor generating apparatus of FIG. 2. Like reference characters will be used for like elements throughout the figures.

Liquid IPA to be vaporized enters the vaporization apparatus through inlet 230 and into a horizontal flow distribution trough 235. Trough 235 has an open top such that when the trough fills up with liquid IPA the liquid flows out of the open top of the trough and over edge 237, the liquid then falls by gravity onto a first downwardly sloped surface 251 of a triangular shaped metal piece 250-1 as shown in FIG. 3. By sloped surface, what is meant is the surface is sufficiently inclined or slanted to permit the liquid IPA to flow along the surface at a rate that permits vapor formation when the temperature of the sloped surfaces is maintained. It will be appreciated that the liquid IPA exits the trough over edge 237, distributed substantially evenly across substantially the entire width of the upper surface 251. The set-point temperature is typically in the range of 80 to 160 C and the design vaporization capacity of the apparatus is typically in the range of 50 to 200 g/min of IPA. Higher vaporization capacity can be achieved by increasing the total heated surface area in the apparatus, the input power, and the overall physical size of the apparatus As liquid IPA flows down the first upper surface 251 in the form of a substantially evenly distributed flowing thin sheet of liquid, some of the liquid is vaporized to generate vapor. The heating energy needed to vaporize the liquid sheet is supplied to the liquid by thermal conduction from the heated triangular metal piece 250-1. Upon reaching the inside vertical surface 270 of panel 206, the remaining un-vaporized liquid will then fall onto a second sloped surface 261 of triangular shaped metal piece 260-1. The liquid will continually vaporize as the liquid sheet flows such that upon reaching the tip 260-A of triangular metal piece 260-1, the un-vaporized liquid present there will then fall onto the triangular metal piece 250-2 below. Each triangular metal piece is similarly heated and acts to similarly vaporize the liquid flow. In this manner, the un-vaporized liquid will continue to travel from one triangular metal piece to the one below and so on until vaporization is complete or the liquid flow has reached 290. The plurality of sloped surfaces as shown in FIG. 4 are arranged in a vertical array such that liquid from an upper sloped surface will flow onto a lower sloped surface. Another way to describe the arrangement of sloped surfaces is that the sloped surfaces are arranged in a vertical zigzag configuration such that liquid will flow from an upper sloped surface to a lower sloped surface. The downwardly sloped surfaces are arranged in alternating directions such that the liquid flow direction is substantially transverse from one sloped surface to the subsequent sloped surface below, the flow always generally in the downward direction.

If any un-vaporized liquid reaches the bottom chamber 290, the liquid will accumulate in the chamber or be exhausted to the outside through outlet 280.

When the sheet of liquid flowing down the sloped surface reaches end of the surface, the forward momentum of the flowing liquid sheet will cause the liquid to continue to travel in the forward direction and eventually impinge on the vertical wall 270, at which point the liquid will fall onto the next sloped surface below.

It should be noted that as vapor is generated from the surface of the liquid sheet, the pressure below the sheet will increase. When the pressure built-up below the sheet is sufficiently large, it will overcome surface tension of the liquid to cause the sheet to rupture, thereby creating flow channels in the sheet for the vapor to flow through. These vapor channel will thus develop naturally without the assistance of any artificial means or mechanisms.

Since the liquid is vaporized by surface evaporation of a sheet of liquid on the heated surface, it is transformed into vapor without much, if any, bubbling taking place. The thickness of the liquid sheet is judged to be on the order of a fraction of a millimeter to a few millimeters. The exact thickness of the flowing liquid sheet is not critical. A natural thickness will develop so that the liquid flowing down the sheet at that velocity will result in a total mass flow of liquid through inlet port 230 to be at the set-point value. Bubbling of liquid and the generation of particulate contaminant in the traditional boiler can thus be greatly reduced, or largely eliminated. The result is the generation of a pure vapor substantially free of particulate contaminant in the IPA vapor flowing out of the apparatus through vapor outlet port 240.

To further avoid the possibility of the presence of particulate contaminant in the IPA vapor generated by the apparatus, a filter 300 can be placed downstream of the vapor outlet port 240 to remove suspended particles in the vapor as shown in FIG. 3. Any high efficiency filter capable of filtering particles in the IPA vapor at the desired operating temperature and pressure of the IPA vapor can be used. A high efficiency stainless steel filter is preferred because of its proven ability to remove gas- and/or vapor-borne particles in semiconductor, integrated device fabrication processes.

Although the present invention has been described with reference to preferred embodiments, workers skilled in the art will recognize that changes may be made in form and detail without departing from the spirit and scope of the invention. They will not be further elaborated.

What is claimed is:

1. An apparatus for vaporizing a liquid to form vapor, said apparatus including an inlet for liquid to enter, and a plurality of heated sloped surfaces to create thin sheets of liquid on the surfaces from which the liquid can vaporize to form vapor.

2. The apparatus of claim 1 wherein the plurality of heated sloped surfaces are arranged in a vertical array such that liquid from an upper sloped surface will flow onto a lower sloped surface.

3. The apparatus of claim 1 wherein the plurality of sloped surfaces are arranged in a vertical zigzag configuration such that liquid will flow from an upper sloped surface to a lower sloped surface.

4. The apparatus of claim 1 and further comprising a trough for receiving liquid from the inlet, the trough extending substantially along a width of an uppermost sloped surface of the plurality of sloped surfaces.

5. The apparatus of claim 4 wherein the trough has an edge over which the liquid flows onto the uppermost sloped surface.

6. The apparatus of claim 1, said liquid comprising isopropyl alcohol.

7. The apparatus of claim 1 including additionally a mechanism to control the rate of liquid flow into said apparatus.

8. The apparatus of claim 1 said apparatus being made of metal, typically aluminum.

9. The Apparatus of claim 1 including additionally a vapor filter to remove suspended particles in the vapor.

10. The apparatus of claim 9 said filter comprising a stainless steel filter.

11. A method to vaporize a liquid to form vapor, said method comprising
heating an apparatus to a selected set-point temperature wherein the apparatus comprises a plurality of heated sloped surfaces to create a thin sheet of liquid on the surfaces from which the liquid can vaporize to form vapor,
introducing said liquid through an inlet of the apparatus such that a thin sheet of the liquid is formed on the sloped surfaces, and
controlling the rate of liquid flow to a selected set-point value.

12. The method of claim 11 wherein the plurality of heated sloped surfaces are arranged in a vertical array such that liquid from an upper sloped surface flows onto a lower sloped surface.

13. The method of claim 11 wherein the plurality of sloped surfaces are arranged in a vertical zigzag configuration such that liquid flows from an upper sloped surface to a lower sloped surface.

14. The method of claim 11 wherein the liquid is distributed across the uppermost sloped surface by exiting a trough extending across the first uppermost surface and being filled with liquid from the inlet.

15. The method of claim of claim 12 wherein the vapor flows upwardly through a vapor channel defined by an upper surface of the thin sheet of the liquid and an overhanging bottom surface of one of the sloped surfaces.

16. The method of claim 11 and additionally filtering the foamed vapor through a stainless steel filter.

17. The method of claim 11 said liquid comprising isopropyl alcohol.

18. A method for generating isopropyl alcohol (IPA) vapor for condensation on a substrate to produce a surface on the substrate substantially free of particulate contaminants, the method comprising:
- providing a thin sheet of flowing liquid IPA on an inclined heated surface, sufficiently heated to produce IPA vapor, the thin sheet of IPA liquid being sufficiently thin so that the liquid will vaporize from the liquid surface substantially free of bubbles and the formation of residue contaminant particles; and
- flowing the liquid over a plurality of inclined heated surfaces arranged so that the liquid IPA flows sequentially over the plurality of surfaces.

19. The method of claim 18 wherein the plurality of heated inclined surfaces are arranged in a vertical array to permit liquid from an upper inclined surface to flow onto a lower inclined surface.

20. The method of claim 18 wherein the plurality of inclined surfaces are arranged in a vertical zigzag configuration such that liquid flows from an upper inclined surface to a lower inclined surface.

21. The method of claim 18 wherein the liquid is distributed across the inclined surface by exiting a trough extending across the inclined surface.

22. The method of claim 18 and additionally filtering the formed vapor through a stainless steel filter.

* * * * *